United States Patent [19]

Logan et al.

[11] Patent Number: 4,627,065
[45] Date of Patent: Dec. 2, 1986

[54] DOUBLE ACTIVE LAYER SEMICONDUCTOR LASER

[75] Inventors: Ralph A. Logan, Morristown; Won-Tien Tsang, New Providence, both of N.J.

[73] Assignee: AT&T Bell Laboratories, Murray Hill, N.J.

[21] Appl. No.: 502,978

[22] Filed: Jun. 10, 1983

[51] Int. Cl.[4] .............................................. H01S 3/19
[52] U.S. Cl. ...................................... 372/50; 357/17; 372/46; 372/48
[58] Field of Search ....................... 372/44, 45, 46, 48, 372/50; 357/17

[56] References Cited

FOREIGN PATENT DOCUMENTS 0061938 10/1982 European Pat. Off. .............. 372/46

OTHER PUBLICATIONS

L. A. Coldren et al., "Monolithic Two-Section GaInAsP/InP Active-Optical-Resonator Devices Formed by Reactive Ion Etching," *Applied Physics Letters*, vol. 38, No. 5, Mar. 1, 1981, pp. 315-317.
S. Akiba et al., "Low-Threshold-Current Distributed-Feedback InGaAsP/InP CW Lasers," *Electronics Letters*, vol. 18, No. 2, Jan. 21, 1982, pp. 77-78.
Y. Abe et al., "Room-Temperature CW Operation of 1.60 μm GaInAsP/InP Buried-Heterostructure Integrated Laser with Butt-Jointed Built-In Distributed--Bragg-Reflection Waveguide," *Electronics Letters*, vol. 18, No. 10, May 13, 1982, pp. 410-411.
D. J. Malyon et al., "102 km Unrepeatered Monomode Fibre System Experiment at 140 Mbit/s with an Injection Locked 1.52 μm Laser Transmitter," *Electronics Letters*, vol. 18, No. 11, May 27, 1982, pp. 445-447.
T. Lee et al., "Short-Cavity InGaAsP Injection Lasers: Dependence of Mode Spectra and Single-Longitudinal-Mode Power on Cavity Length," *IEEE Journal of Quantum Electronics*, vol. QE-18, No. 7, Jul. 1982, pp. 1101-1113.
H. Nagai et al., "InGaAsP/InP Dual-Wavelength BH Laser", *Japanese Journal of Applied Physics*, vol. 21, No. 3, Mar. 1982, pp. L173-L175.

*Primary Examiner*—James W. Davie
*Attorney, Agent, or Firm*—Richard D. Laumann

[57] ABSTRACT

A double active layer semiconductor laser having single longitudinal mode operation is described. The laser comprises first and second active layers which are separated from each other by an intermediate barrier layer but are optically coupled to each other so that, effectively, single mode operation results.

13 Claims, 3 Drawing Figures

DOUBLE ACTIVE LAYER SEMICONDUCTOR LASER

TECHNICAL FIELD

This invention relates generally to semiconductor lasers and particularly to such lasers having at least two active layers.

BACKGROUND OF THE INVENTION

Optical communications systems have been developed in recent years in response to the demand for high capacity and long distance communications systems. Such optical communications systems as presently contemplated have a light source and a photodetector that are optically coupled to each other by means of a glass transmission line. The glass transmission line is commonly referred to as an "optical fiber" by those skilled in the art and the optical fibers presently contemplated for communications use are silica-based compositions.

For highest capacity operation and for longest distance operation without need for repeaters, a single frequency semiconductor laser is presently the light source of choice. The term "single frequency" as used in this application means a narrow spectral output corresponding to single longitudinal mode operation. A laser with such an output characteristic minimizes problems, e.g., limited repeater spacings or lower data rates, associated with optical fiber dispersion. The wavelength range between 1.3 and 1.6 $\mu m$ is presently the wavelength range of greatest interest because within this range both dispersion and optical loss of the optical fiber are at a minimum although not necessarily at the same wavelength.

It should be noted that it has become apparent to those skilled in the art that the term "single longitudinal mode" is capable of several interpretations from the viewpoint of optical communications systems. The observation of single longitudinal mode output from a semiconductor laser under steady state excitation does not guarantee that the laser will emit a single frequency output under actual modulation conditions. This statement is especially true at very high bit rates and when the fibers are not dispersion free at the operating wavelength. Accordingly, to those skilled in the optical communications art at the present time, the term "single longitudinal mode output" has come to mean single longitudinal mode output from a, for example, semiconductor injection, laser when it is being modulated under actual, for example, high data rate, operating conditions.

A variety of approaches has been taken in attempts to develop single frequency, that is, single longitudinal mode operation, semiconductor lasers. For example, single frequency operation in semiconductor lasers has been achieved by several approaches, including distributed feedback (DFB), distributed Bragg reflector (DBR), injection locking, coupled cavity lasers, and very short cavity lasers. See, for example, *Electronics Letters*, 18, pp. 77–78, Jan. 21, 1982; *Electronics Letters*, 18, pp. 410–411, May 13, 1982; *Electronics Letters*, 18, pp. 445–447, May 27, 1982; *Applied Physics Letters*, 38, pp. 315–317, Mar. 1, 1981; and *IEEE Journal of Quantum Electronics*, QE-18, pp. 1101–1113, July 1982.

While these approaches may be perfectly adequate for many applications, many of them suffer drawbacks such as complicated fabrication techniques. This drawback is especially true for the DFB and DBR lasers. It has also been observed for several of these approaches that stable single longitudinal mode operation occurs over only relatively narrow current injection ranges.

SUMMARY OF THE INVENTION

We have found that stable single longitudinal mode operation occurs in semiconductor injection lasers having two active layers having different Fabry-Perot mode spacings. The Fabry-Perot modes from each active layer that coincide spectrally become enforced resulting in single longitudinal mode output. The laser comprises a first cladding layer; a first active layer; a barrier layer; a second active layer; and a second cladding layer. The first cladding layer has a first conductivity type and the second cladding layer has a second conductivity type. The barrier layer is sufficiently thin so that the evanescent field of each active layer is seen by the other active layer, i.e., the two active layers are optically coupled to each other. In one embodiment, the laser is a buried crescent laser having first and second crescent-shaped active layers separated by a crescent-shaped barrier layer. The crescent shape of the active layers is desirable because of the different sizes and shapes of the active layers and thus different Fabry-Perot mode spacings. The height of the barrier layer is relatively low and the layer is thin and, as a result, carriers are injected into both active layers. In a further embodiment, the layers of the lasers comprise Group III-V compound semiconductors such as InGaAsP.

DETAILED DESCRIPTION

Figure 1:
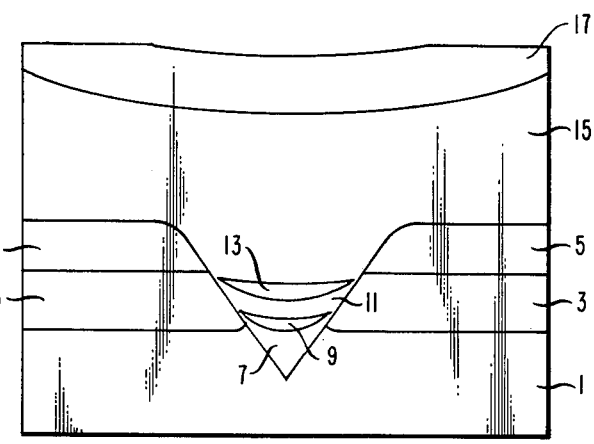
FIG. 1 is an end view of a double active layer laser according to this invention.

A double-active-layer laser according to this invention is shown in an end view in FIG. 1. For reasons of clarity, the elements of the laser are not drawn to scale. The laser depicted comprises substrate 1 having a first conductivity type, first epitaxial layer 3 having a second conductivity type, and second epitaxial layer 5 having a first conductivity type. Within layers 3 and 5 as well as substrate 1, there is a groove. Within the groove, there is grown first cladding layer 7, first active layer 9, barrier layer 11, second active layer 13, and second cladding layer 15. Layers 7, 9, and 11 have a first conductivity type and layers 13 and 15 have a second conductivity type. Contact layer 17 has the second conductivity type and is heavily doped as is the substrate. Portions of layers 7, 9, 11, and 13 are also grown to a limited extent on layer 3 although to thicknesses less than those in the groove due to different rates of crystal growth. For reasons of clarity, these portions are not shown.

The barrier layer has a bandgap that is larger than the bandgaps of the active layers. The barrier layer has a thickness that permits the evanescent field of each active layer to be seen by the other active layer, i.e., the active layers are optically coupled to each other. The thickness should, however, be sufficient so that the active layers do not behave as a single waveguide. Thicknesses within the range from 0.1 μm to 1.0 μm are preferred. Both the sizes and shapes of the cross-sections of the active layers differ and the Fabry-Perot mode spacings in the active layers will differ. The first and second active layers have essentially the same composition but are separated from each other by the barrier layer. Suitable thicknesses and doping concentrations for the cladding and active layers will be known to those skilled in the art and need not be described in detail. In a particular embodiment, the substrate comprised n-type InP, and the layers comprised InGaAsP.

The structure depicted is of a type that has come to be called a buried crescent laser by those skilled in the art. The reverse biased p-n junction formed by layers 3 and 5 confines the injected current to the groove when the device is operated. However, the structure differs significantly from a conventional buried crescent laser in that it has two active layers.

The precise location of the p-n junction between the cladding layers is not critical. For example, it may be located at the interfaces of the first active and first cladding layers; the first active and barrier layers; the barrier and the second active layers; or the second active and second cladding layers. The conductivity types of the active layers may differ from those described depending upon the precise location of the p-n junction. For example, layer 7 may have the first conductivity type and layers 7, 11, 13, and 15 may have the second conductivity type. Other arrangements are also possible provided that there is only a single electrical junction located at one of these interfaces. Structures other than the reverse biased p-n junction may be used to confine the current to the groove. For example, the groove may be in an insulating layer.

The structure is expediently formed by liquid phase epitaxy using growth procedures that are identical to those used in the fabrication of single active layer buried crescent lasers except for the growth of the additional layers. Layers 3 and 5 are grown and a $SiO_2$ etch mask is thermally deposited. V-grooves are formed by using an appropriate etchant, for example, $3HCl:1H_3PO_4$ for InGaAsP to etch through the windows in the mask. The structure is then chemically cleaned and stripped of $SiO_2$ in, for example, buffered HF, and the epitaxial layers forming the laser are grown in the groove. Other etchants and materials for cleaning, stripping the etch mask, etc., suitable for use with other compound semiconductors are well known to those skilled in the art. After ohmic contacts were fabricated, laser diodes having optical cavity lengths of 300 μm and 125 μm were cleaved.

Although the compositions of the two active layers are essentially identical, their geometrical sizes and shapes differ. The active layers should have the same composition so that they lase at the same wavelength. As is evident from FIG. 1, growth of the active layers in the V-groove ensures that both the sizes and shapes of the two active layers are different. Consequently, the propagating modes in each active stripe have different effective refractive index, $N_{EFF}$. As both active layers have the same Fabry-Perot optical cavity length, L, the longitudinal mode spacings for the first and second active layers are slightly different. The mode spacings are by $\Delta\lambda_i$, which is approximately equal to $\lambda_0^2/2N_{EFFi}$ L, where i is either one or two depending upon whether the first or second active layer is being referred to. $\lambda_0$ is the wavelength of the radiation in free space. As the two active layers approach each other and become optically coupled, the Fabry-Perot modes that coincide spectrally interfere constructively and become the reinforced Fabry-Perot modes of the laser. The modes that do not interfere constructively are suppressed. The spectral spacing of the enforced Fabry-Perot modes is significantly larger than the original Fabry-Perot mode spacings of the individual cavities and depends upon the difference between $N_{EFF1}$ and $N_{EFF2}$. The spectral mode spacing is given by $\Lambda=\lambda_0^2/2L|N_{EFF1}-N_{EFF2}|$. This analysis is similar in spirit to that used to analyze a coupled cavity laser.

The first and second active stripes comprise essentially the same material and, therefore, the spectral gain profile for both active layers is the same. Accordingly, when an enforced mode falls near the gain maximum, the normal gain roll-off is sufficient to suppress the adjacent enforced modes even during the fast turn-on transient. This is especially true for InGaAsP which has a rather fast gain roll-off.

It is not essential that both active stripes lase at the same time. However, for relatively thin barrier layers and low barrier heights, it is to be expected that carriers will be injected into both active stripes. Furthermore, the proximity of the active layers to each other enables them to photo-pump each other. Far field radiation measurements confirm that both active layers lased at essentially the same time. However, even if it is assumed that only one active layer lases, the other active layer must be adequately photo-pumped so that the gain is equal to the overall losses of the composite cavity. In this case, the nonlasing active layer has a regular light-emitting diode Fabry-Perot intensity modulation and the resultant effect is the same as when both layers lase.

Another hypothesis is that the lasing mode, which is an optical standing wave in the Fabry-Perot cavity, in one of the active stripe layers sets up a periodic density modulation in the other active layer. Consequently, the effect is similar to the establishment of a distributed feedback grating which permits propagation of only a single longitudinal mode.

Figure 2:
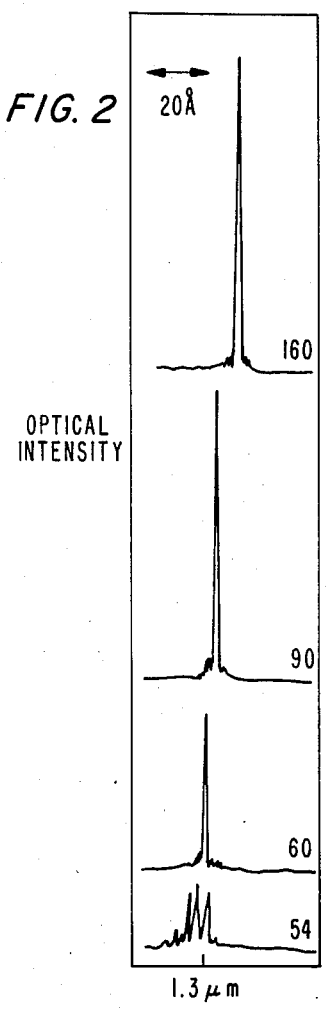
FIG. 2 plots the optical intensity vertically in arbitrary units versus the wavelength horizontally for a double active laser according to this invention having a 300 $\mu m$ long optical cavity.
Figure 3:
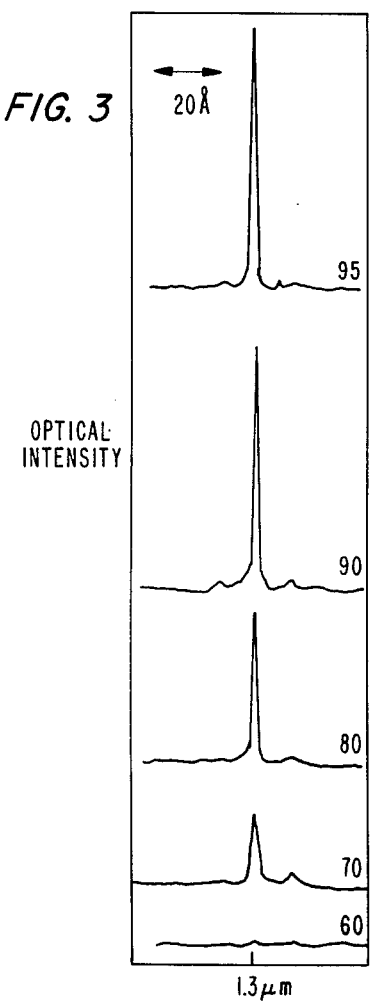
FIG. 3 plots the optical intensity vertically in arbitrary units versus the wavelength horizontally for a double active layer laser according to this invention having a 125 $\mu m$ long optical cavity.

FIG. 2 plots the light output intensity vertically in arbitrary units versus the wavelength horizontally for a double active layer laser having a 300 μm long optical cavity. FIG. 3 plots the light output intensity vertically in arbitrary units versus the wavelength horizontally for a double active layer laser having a 125 μm long optical cavity. A 20 Angstrom wavelength range is indicated on both FIGS. 2 and 3. The several curves in both FIGS. 2 and 3 are for different injection current levels, in units of mA, which are as indicated. The spectra depicted represent the time integration of the spectral components within each pulse and are averaged over a large number of pulses. However, the results depicted are typical. As can be seen, the output of the double active layer crescent lasers is a highly stable single longitudinal mode for the current range which is greater than 1.1 times the current threshold. Comparable single active layer crescent lasers were generally multi-longitudinal mode. It was also observed that the longitudinal mode hopping to the neighboring mode is reduced as the current injection is increased. In fact, for the short optical cavity double active layer lasers, the laser diodes operated in the same longitudinal mode without hopping up to at least twice the current threshold.

The time resolved transient mode spectra of the lasers were also investigated under fast step current excitation, that is, current excitation with approximately a 1 nsec rise time. Although regular single active layer crescent lasers did not operate in a single longitudinal mode even after 10 nsec when the steady state condition was well established, the long optical cavity double active layer crescent lasers quickly concentrated their power into a single dominant longitudinal mode after only 1 nsec.

As has been previously explained, when the cavity length L of the double active layer laser is reduced, the composite mode spacing should be further increased. This was confirmed by experimental observations with the short active layer lasers. Clean and stable single longitudinal mode operation was established just above threshold. Furthermore, the double active layer lasers remained in the same longitudinal mode after the onset of the optical pulse. No mode hopping was observed and transient relaxation oscillations were not significant.

Other modifications will be readily thought of by those skilled in the art. For example, other Group III-V compound semiconductors, for example, AlGaAs, may be used for the epitaxial layers. Similarly, other Group III-V compound semiconductors may be used for the substrate.

What is claimed is:

1. In a semiconductor laser comprising a substrate having a first conductivity type and sequentially disposed thereon a plurality of layers comprising a first cladding layer, said first cladding layer having a first conductivity type, a first active layer, a barrier layer, a second active layer, a second cladding layer, said second cladding layer having a second conductivity type, electrical contacts to said first and second cladding layers, said first and second active layers comprising essentially the same composition and having different Fabry-Perot mode spacings and being optically coupled to each other.

2. A semiconductor laser as recited in claim 1 further comprising, on said substrate a first epitaxial layer having a second conductivity type and a second epitaxial layer having a first conductivity type, said first and second active layers and said barrier layer of said plurality of layers being in a groove in said first and second epitaxial layers and said substrate.

3. A semiconductor laser as recited in claim 2 in which said first and said second active layers are crescent-shaped.

4. A semiconductor laser as recited in claim 3 in which said barrier layer is between approximately 0.1 $\mu$m and 1.0 $\mu$m thick.

5. A semiconductor laser as recited in claim 4 in which said layers of said semiconductor laser comprise at least one Group III-V compound semiconductor.

6. A semiconductor laser as recited in claim 5 in which said Group III-V compound semiconductor comprises InGaAsP.

7. A semiconductor laser as recited in claim 5 in which said Group III-V compound semiconductor comprises AlGaAs.

8. A semiconductor laser as recited in claim 1 further comprising at least one insulating epitaxial layer on said substrate, said first and second active layers and said barrier layer of said plurality of layers being in a groove in said insulating layer.

9. A semiconductor laser as recited in claim 8 in which said first and said second active layers are crescent-shaped.

10. A semiconductor laser as recited in claim 9 in which said barrier layer is between approximately 0.1 $\mu$m and 1.0 $\mu$m thick.

11. A semiconductor laser as recited in claim 10 in which said layers of said semiconductor laser comprise at least one Group III-V compound semiconductor.

12. A semiconductor laser as recited in claim 11 in which said Group III-V compound semiconductor comprises InGaAsP.

13. A semiconductor laser as recited in claim 11 in which said Group III-V compound semiconductor comprises AlGaAs.

* * * * *